United States Patent [19]

Sekiguchi et al.

[11] Patent Number: 4,592,016

[45] Date of Patent: May 27, 1986

[54] MAGNETIC BUBBLE MEMORY DEVICE

[75] Inventors: Yoshihiro Sekiguchi, Tachikawa; Kazutoshi Yoshida; Shinsaku Chiba, both of Mobara; Mamoru Sugie, Sayama; Hirokazu Aoki, Hachioji, all of Japan

[73] Assignee: Hitachi, Ltd., Tokyo, Japan

[21] Appl. No.: 557,458

[22] Filed: Dec. 2, 1983

[30] Foreign Application Priority Data

Dec. 3, 1982 [JP] Japan .................................. 57-211428

[51] Int. Cl.[4] .............................................. G11C 19/08
[52] U.S. Cl. ............................................ 365/15; 365/1
[58] Field of Search .................................. 365/15, 16, 1

[56] References Cited

U.S. PATENT DOCUMENTS 4,228,522 10/1980 George .................................. 365/15

Primary Examiner—James W. Moffitt
Attorney, Agent, or Firm—Antonelli, Terry & Wands

[57] ABSTRACT

A magnetic bubble memory device comprises a plurality of minor loops for storage of data information and a map loop for storage of defective-loop information, etc. The number of bits of the map loop is selected to be N times as large as the number of bits of each minor loop, N being an integer not smaller than 2.

9 Claims, 2 Drawing Figures

MAGNETIC BUBBLE MEMORY DEVICE

BACKGROUND OF THE INVENTION

The present invention relates to a magnetic bubble memory device, and more particularly to an improvement of a map loop structure suitable for defective-loop handling.

A magnetic bubble memory device usually uses a major/minor loop scheme which employs a major loop for controlling read/write of information and a plurality of minor loops for storing information. In such a major/minor scheme magnetic bubble memory device, one loop (map loop) is provided for the plurality of data storing minor loops (data loops) stored in the map loop are defect information of the respective minor loops, an index code for address synchronization of the magnetic bubble memory device and an error correction code. Accordingly, the map loop requires a larger number of bits than the number of the data storing minor loops.

However, when the number of bits of each minor loop (which is equal to the number of bits of the map loop because the conventional map loop has the same loop configuration as that of the minor loops) is equal to or smaller than the number of minor loops, the defective-loop information cannot be stored in the map loop. In order to increase a memory capacity, the increase of the number of minor loops (corresponding to the number of bits per page) is necessary.

SUMMARY OF THE INVENTION

It is an object of the present invention to provide a magnetic bubble memory device capable of storing defective-loop information even when the number of minor loops is equal to or larger than the number of bits of each minor loop for storage of data information.

In order to achieve the above object, in accordance with the present invention, the number of bits of a map loop is increased to be larger than the number of bits of each data storing minor loop. More specifically, the number of bits of the map loop is selected to be an integer multiple (no smaller than 2) of the number of bits of each minor loop.

DESCRIPTION OF THE PREFERRED EMBODIMENT

Figure 1:
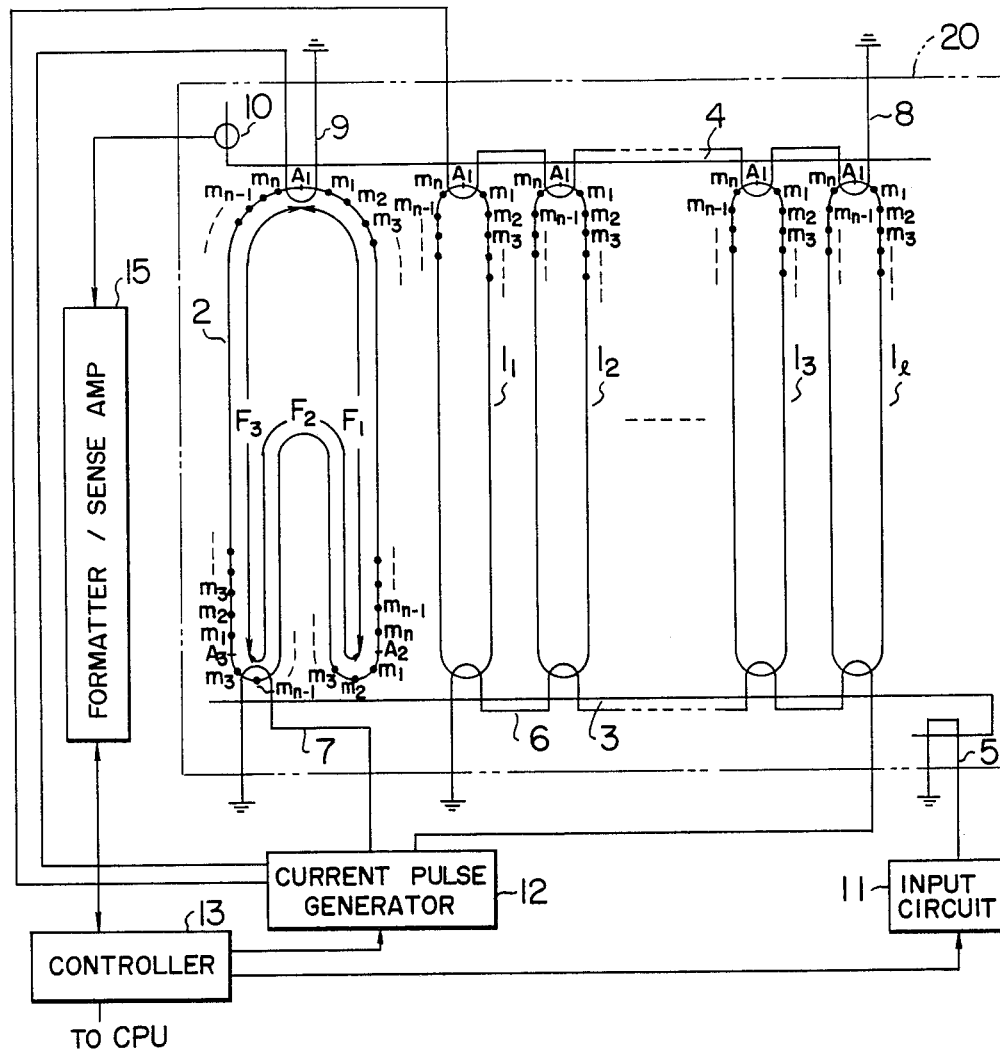
FIG. 1 shows an enlarged plan view of a magnetic bubble memory device or chip in accordance with one embodiment of the present invention together with a peripheral circuit.

FIG. 1 shows an enlarged plan view of a magnetic bubble memory device or chip 20 in accordance with one embodiment of the present invention. Numeral 1 denotes minor loops for storage of data information, and numeral 2 denotes a map loop for storing defective-loop information concerning the presence or absence of defect for the minor loops, and other information. The map loop 2 has a number of bits which is three times as large as the number of bits of each minor loop 1. Numeral 3 denotes a write major line for writing information into the minor loops 1 or the map loop 2, numeral 4 denotes a read major line for reading out information from the minor loops 1 or the map loop 2 and numeral 5 denotes a generator for generating magnetic bubbles as information in the write major line 3. Predetermined pulses are applied to the generator 5 from an input circuit 11. Numeral 6 denotes a minor loop swap gate for swapping the information on the minor loop 1 with the write information on the write major line 3 and numeral 7 denotes a map loop swap gate for swapping the information on the map loop 2 write the with information on the write major line 3. A swap pulse is applied to the swap gate 6 or 7 from a current pulse generator 12 at a controlled timing. Numeral 8 denotes a minor loop replicator for replicating the information on the minor loop 1 to the read major line 4 and numeral 9 denotes a map loop replicator for replicating the information on the map loop 2 to the read major line 4. A replicate pulse is applied to the replicator 8 or 9 from the current pulse generator 12 at a controlled timing. Numeral 10 denotes a detector for detecting the presence or absence of a magnetic bubble corresponding to the information read into the read major line 4. The input circuit 11 and the current pulse generator 12 are controlled by a controller 13. The information detected by the detector 10 is supplied to a data formatter/sense amplifier 15.

In FIG. 1, the bit positions in the minor loops 1 and the map loop 2 are shown by m, and the minor loops 1 each has $(n+1)$ bits and the map loop 2 has $3(n+1)$ bits. By way of example, the number of minor loops is 280, the number of bits of each minor loop is 257, and the number of bits of the map loop is 771. In addition to the shown 1 minor loops, some redundant (or spare) loops (and error correction loops) are prepared. The redundant loops are used in place of the defective minor loops.

Figure 2:
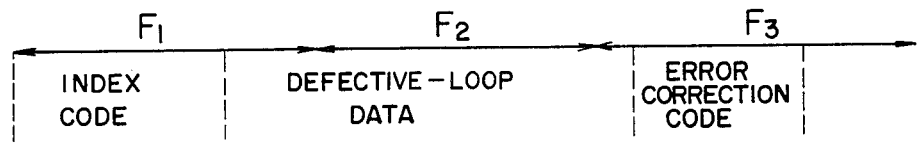
FIG. 2 illustrates information stored in a map loop.

Since the number of bits of the minor loop is selected to be three times as large as the number of bits of each minor loop 1, when the address $A_2$ or $A_3$ of the map loop 2 is at the position of the address $A_1$, it corresponds to the position of the address $A_1$ of the minor loop 1. Therefore, the magnetic bubble memory device can be controlled by recognizing the address $A_1$ of the minor loop 1 with reference to the address $A_1$, $A_2$ or $A_3$ of the map loop 2 to synchronize it with the address $A_1$ of the minor loop 1. In other words, since the minor loop 1 is rotated three revolutions while the map loop 2 is rotated one revolution, the address synchronization between the map loop 2 and the minor loops 1 is attained. Thus, even when the number of minor loops 1 is larger than the number of bits of each minor loop 1, the defective-loop information, index code and error correction code can be stored in the map loop 2. FIG. 2 illustrates the information stored in the map loop 2.

The data formatter/sense amplifier 15 has a function to read out the defective-loop information and other information from the map loop 2 upon bubble initialization and determine minor loops to be used in which defective minor loop(s) are replaced by redundant (or spare) loop(s) additionally prepared. In an error correction mode, the error correction code is added to the data transferred from the controller 13 and the data is stored in the loop. In a read mode, the data formatter/sense amplifier 15 generates the code based on the data from the loop and compares it with the code read from the bubble to check if an error is included and if the error is correctable, and informs the result to the controller 13.

In operation, after the power-on, an CPU sets parameters to determine the number of bubble chips and the error correction mode, and sends an INITIALIZA- TION command to the controller 13. The controller 13 reads out the content of the map loop 2 through the data formatter/sense amplifier 15 to determine the zero page position and the minor loops to be used. Then, the CPU sets parameters to designate the number of pages to be written and the beginning page and sends a WRITE BUBBLE command to the controller 13. The controller 13 applies a rotating field to the bubbles until the designated page is reached and transfers the write data to the write track. When the designated page is reached, the swap pulse current is supplied by the current pulse generator 12 to the minor loop swap gate 6 so that the data is written in the minor loops.

In a read mode, the CPU sets parameters to designate the number of pages to be read and the beginning page and send a READ BUBBLE command to the controller 13.

Since the above operations are well known, no further detail is described here.

While the number of bits of the map loop is three times as large as that of each minor loop in the above embodiment, the present invention is not limited thereto and the same advantage is attained when the number of bits of the map loop is an integer multiple which is no smaller than one such as 2, 4 or 5 times of the number of bits of each minor loop.

In the above embodiment, the map loop is of folded loop shape in which the map loop is folded toward the read major line at the write major line. However, the present invention is not limited to such a map loop shape but may other map loop shapes may be used.

As described hereinabove, according to the present invention, even when the number of minor loops is equal to or larger than the number of bits of each minor loop, the defective-loop information and other information can be stored in the map loop by selecting the number of bits of the map loop to the integer multiple of the number of bits of each minor loop. By using the address of the map loop as the reference, the address synchronization between the map loop and the minor loops is attained. Thus, when the number of minor loops is equal to or larger than the number of bits of each minor loop, the present map loop scheme allows the control of the magnetic bubble memory device.

We claim:

1. A magnetic bubble memory device comprising on a chip:
    a write major line;
    a read major line;
    a plurality of minor loops for storage of data information, each of said minor loops being associated with said write major loop so that the data information is written from said write major line into the minor loop and with said read major line so that the data information is read from the minor loop into said read major line, said minor loops having the same number of bits; and
    a map loop for storage of at least defective-loop information concerning the presence or absence of a defect for said minor loops, said map loop being associated with said write major line so that the defective-loop information is written from said write major line into said map loop and with said read major line so that the defective-loop information is read from said map loop into said read major line, said map loop having bits the number of which is N times as large as the bit number of each of said minor loops, N being an integer not smaller than 2.

2. A magnetic bubble memory device according to claim 1, wherein said map loop is folded toward said read major line at said write major line.

3. A magnetic bubble memory comprising:
    a plurality of loops for storing data information, the total number of said plurality of loops being greater than the number of storage bits of each of said loops; and
    magnetic storage map circuit means for storing map information of wheather each of said loops is to be utilized for data storage, said magnetic storage map circuit means having a storage capacity greater than the number of storage bits of each loop.

4. A magnetic bubble memory according to claim 3, wherein said magnetic storage map circuit means has a storage capacity N times as large as said number of storage bits of each loop, N being an integer greater than 1.

5. A magnetic bubble memory according to claim 3, further comprising:
    a write major line;
    a read major line;
    write gate means for controllably transferring information in parallel from said write major line to said loops;
    read gate means for controllably transferring information in parallel from said loops to said read major line;
    map write gate means for controllably transferring the map information from said write major line to said magnetic storage map circuit means; and
    map read gate means for controllably transferring the map information from said magnetic storage map circuit means to said read major line.

6. A magnetic bubble memory according to claim 5, wherein said magnetic storage map circuit means comprises a single map storage circuit.

7. A magnetic bubble memory comprising:
    a plurality of loops for storing data information, the total number of said loops being greater than the number of storage bits of each of said loops;
    magnetic storage map circuit means for storing map information of whether each of said loops is to be utilized for data storage, said magnetic storage map circuit means having a storage capacity N times as large as said number of storage bits of each loop, N being an integer greater than 1;
    a write major line;
    a read major line;
    write gate means for controllably transfering information in parallel from said write major line to said loops;
    read gate means for controllably transferring information in parallel from said loops to said read major line;
    map write gate means for controllably transferring map information from said write major line to said magnetic storage map circuit means;
    read gate means for controllably transferring the map information from said magnetic storage map circuit means to said read major line;
    bubble generator means for controllably generating magnetic bubbles;
    formatter/sense amplifier means for reading out the data information and the map information;
    current pulse generator means for driving said write gate means, read gate means, map write gate means and map read gate means; and input circuit means for deriving outputs of write information to said bubble generator means; and controller means for controlling the operation of said formatter/sense amplifier means, current pulse generator means and input circuit means.

8. A magnetic bubble memory according to claim 7, wherin said magnetic storage map circuit means comprises a single map storage circuit.

9. A magnetic memory according to claim 8, wherein said map storage circuit is a map loop folded toward said read major line at said write major line.

* * * * *